United States Patent [19]

Nawa et al.

[11] Patent Number: 5,514,475

[45] Date of Patent: May 7, 1996

[54] HEAT-RESISTANT ELECTRICAL INSULATING LAYER

[75] Inventors: Kazunari Nawa, Nishinomiya; Haruyuki Kano; Yoshihisa Sone, both of Ibaraki, all of Japan

[73] Assignee: Sumitomo Metal Industries, Ltd., Osaka, Japan

[21] Appl. No.: 183,756

[22] Filed: Jan. 21, 1994

[30] Foreign Application Priority Data

Jan. 22, 1993 [JP] Japan .................................. 5-009455
Jan. 22, 1993 [JP] Japan .................................. 5-009456

[51] Int. Cl.⁶ .................................................. B32B 27/00
[52] U.S. Cl. ........................ 428/411.1; 428/209; 428/273; 428/426; 428/457; 428/626; 428/901; 361/750
[58] Field of Search ............................... 428/209, 411.1, 428/901, 228, 297, 426, 435, 457, 458, 626, 273; 361/750

[56] References Cited

U.S. PATENT DOCUMENTS

| | | | |
|---|---|---|---|
| 4,758,653 | 7/1988 | Otani et al. | 528/396 |
| 5,017,683 | 5/1991 | Otani et al. | 528/396 |
| 5,126,467 | 6/1992 | Itagaki et al. | 556/413 |

FOREIGN PATENT DOCUMENTS

| | | |
|---|---|---|
| 62-521 | 1/1987 | Japan . |
| 62-522 | 1/1987 | Japan . |

*Primary Examiner*—Patrick J. Ryan
*Assistant Examiner*—Marie R. Yamnitzky
*Attorney, Agent, or Firm*—Burns, Doane, Swecker & Mathis

[57] ABSTRACT

A heat-resistant, electrical insulating layer which is suitable for use as an insulating substrate in printed circuit boards and as an insulating film for semiconductor devices and which surpasses a polyimide-based insulating layer with respect to heat resisting properties, dielectric properties, and water absorption. The insulating layer comprises a polycondensed fused polycyclic, polynuclear aromatic resin prepared by a polycondensation reaction of a starting material with a crosslinking agent in the presence of an acid catalyst. The starting material is selected from the group consisting of fused polycyclic aromatic hydrocarbons which may have a hydroxyl group as a ring substituent and mixtures of a fused polycyclic aromatic hydrocarbon and a monocyclic aromatic hydrocarbon both of which may have a hydroxyl group as a ring substituent. The crosslinking agent is an aromatic compound having at least two hydroxymethyl or halomethyl groups as ring substituents.

27 Claims, No Drawings

HEAT-RESISTANT ELECTRICAL INSULATING LAYER

BACKGROUND OF THE INVENTION

The present invention relates to an electrical insulating layer (hereinafter referred to as an insulating layer) having excellent heat resistance and a low dielectric constant, exhibiting low water absorption, and capable of being prepared from relatively inexpensive starting materials. The insulating layer of the present invention is useful as an insulating substrate for printed circuit boards and as an insulating film for various purposes in semiconductor devices.

Printed circuit boards comprising an insulating substrate having an electrically conductive printed pattern on the surface thereof have been widely used as substrates for mounting electronic devices. Printed circuit boards are classified into rigid boards and flexible boards. Both types have a substrate which is usually made of a resin or resinous material. Substrates for use in rigid printed circuit boards are usually prepared by impregnating a base material such as paper, glass cloth, or glass mat with a prepolymer of a thermosetting resin such as a phenolic resin, epoxy resin, or unsaturated polyester resin, drying the impregnated base material to form a prepreg, and laminating a plurality of plies of the prepreg to form a laminated sheet. Flexible printed circuit boards, which were developed to respond to a demand for electronic devices of smaller dimensions, have substrates comprised merely of a flexible film of a thermosetting resin.

With an increase in packaging density in recent years, insulating substrates are required to have an increased heat resistance, particularly with respect to long-term heat resistance, and a decreased dielectric constant. In order to meet these requirements, a polyimide resin which is a typical heat-resistant thermosetting resin has been used to produce an insulating substrate including a flexible substrate and a rigid substrate based on a glass cloth or glass mat.

An insulating layer made of a resin is also used as an insulating film for various purposes in semiconductor devices. Such insulating films include interfacial insulating films for electrically separating adjacent layers in a multi-layered printed circuit board, passivation films used to cover p-n junction surfaces for stabilization, buffer films for protecting a semiconductor device from applied forces, and α-ray shielding films used in DRAM's and high-speed bipolar IC's. Recently, an insulating film has been used in a multichip module (MCM).

Due to heat generation during the operation of a semiconductor device, an insulating film for use in semiconductor devices is required to have good long-term heat resistance in addition to good insulating properties including a low dielectric constant and a high resistivity. It is also desirable to have good mechanical properties and chemical resistance. In order to meet these requirements, interfacial films and passivation films have been formed mostly from an inorganic insulating substance such as silicon dioxide or glass in the prior art. However, there is a recent trend to use a polyimide resin to form an insulating film for semiconductor devices. An insulating film made of an organic resin is also useful as a buffer film or an α-ray shielding film. Such a film can be formed by coating with a resin solution followed by drying or baking, which is a simpler process than the process used to form an inorganic film which includes sintering at a high temperature or a chemical reaction such as oxidation.

It is known that a polyimide resin has excellent heat resistance and can withstand a high temperature above 300° C. However, such a temperature is the maximum short-term heat resisting temperature, and the maximum long-term heat resisting temperature of the resin is as low as about 200° C., although it is still much higher than that of an epoxy resin (about 150° C. or lower). A polyimide resin also has a low dielectric constant in the range of 3.5–3.7, a high volume resistivity on the order of $10^{16}$–$10^{17}$ Ω-cm at room temperature, and good chemical resistance. Therefore, among commercially available resins, a polyimide resin is regarded as the material having the highest performance both for substrates of printed circuit boards and for insulating films for semiconductor devices.

However, polyimide resin films are expensive, and they have a relatively high water absorption on the order of 3% as measured by immersion in water for 24 hours at 25° C. due to a high polarity of imide groups. Water absorption may cause the films to blister, which may in turn produce shear of the circuit formed thereon or even a short circuit. The dielectric constant of polyimide films increases to 4.5–4.7 when glass fibers are present therein as in the case of rigid substrates.

SUMMARY OF THE INVENTION

It is an object of the present invention to provide a heat-resistant insulating layer formed from a resin which has superior long-term heat resistance, dielectric constant, and water absorption compared to a polyimide resin and which is capable of being prepared less expensively than a polyimide resin.

Another object of the present invention is to provide an insulating substrate for printed circuit boards which has improved long-term heat resistance and dielectric properties and which enables the printed circuit board to have an increased signal processing speed and a higher packaging density.

It is a further object of the present invention to provide an insulating film which can be prepared less expensively than a polyimide film, which exhibits high performance comparable to a polyimide film, and which has low water absorption.

The present invention provides a heat-resistant, electrical insulating layer suitable for use as an insulating substrate for printed circuit boards and for use as an insulating film for semiconductor devices, which comprises a polycondensed fused polycyclic, polynuclear aromatic resin (hereinafter abbreviated as COPNA resin) prepared by a polycondensation reaction of a starting material with a crosslinking agent in the presence of an acid catalyst, wherein the starting material is selected from the group consisting of fused polycyclic aromatic hydrocarbons which may have a hydroxyl group as a ring substituent and mixtures of a fused polycyclic aromatic hydrocarbon and a monocyclic aromatic hydrocarbon both of which may have a hydroxyl group as a ring substituent and wherein the crosslinking agent is an aromatic compound having at least two hydroxymethyl or halomethyl groups as ring substituents. The electrical insulating layer of the present invention has heat resisting properties and dielectric properties superior to those of a polyimide-based insulating layer.

In one embodiment, an insulating substrate for printed circuit boards comprises a COPNA resin which may be in the form of either a film consisting essentially of a COPNA resin or a fiber-reinforced COPNA resin comprising the COPNA resin and reinforcing fibers, particularly glass fibers. The fiber-free film of a COPNA resin is mostly used as a flexible substrate for printed circuit boards, but it may be used as a rigid substrate by heating the film for curing for a period sufficient to form a rigid film. The insulating substrate of a glass fiber-reinforced COPNA resin is a rigid substrate and is usually prepared by laminating a plurality of plies of a prepreg prepared by impregnating reinforcing fibers with a prepolymer of COPNA resin.

In another embodiment, an insulating film for semiconductor devices consists essentially of a COPNA resin. The insulating film encompasses any film used in semiconductor devices for the purpose of electrical insulation which includes the above-described interfacial films, passivation films, buffer films, α-ray shielding films, and films in MCM's.

DETAILED DESCRIPTION OF THE INVENTION

The COPNA resin used as a base resin material in the insulating layer of the present invention has excellent heat resisting properties. The maximum short-time and long-term heat resisting temperatures of the resin are about 400° C. and about 260° C., respectively. A polyimide resin is known to withstand a high temperature above 300° C. However, such a temperature is the maximum short-time heat resisting temperature, and its maximum long-term heat resisting temperature falls to about 200° C. In addition, the COPNA resin has a dielectric constant of about 3.1 in the form of a neat resin or about 3.7 in the form of a glass-reinforced resin, which is lower than that of a polyimide resin since the dielectric constant of a polyimide resin is about 3.6 in the form of a neat resin or about 4.6 in the form of a glass-reinforced resin.

Furthermore, the water absorption of the COPNA resin is about 0.4% as measured by immersion in water for 24 hours at 25° C., which is much lower than that of a polyimide resin (about 3%).

Therefore, an insulating layer based on a COPNA resin is superior to a conventional heat-resistant insulating layer based on a polyimide resin with respect to not only heat resistance, including long-term heat resistance, but also with respect to dielectric properties and water absorption. As a result, when the insulating layer is used as an insulating substrate for printed circuit boards, it is possible to provide a printed circuit board which has an increased signal processing speed and improved reliability and which allows electronic devices to be mounted thereon with an increased density. When used as an insulating film for semiconductor devices, the superior properties of a COPNA resin make it possible to provide the semiconductor devices with improved performance.

A COPNA resin and its preparation are described in U.S. Pat. No. 5,017,683 and Japanese Patent Application Kokai No. 62-521 and No 62-522. In the U.S. patent, it is stated that a COPNA resin has good heat resistance and good electrical insulating Properties- However, it is not suggested therein that the heat resistance, particularly the long-term heat resistance, and insulating properties of a COPNA resin are superior to those of a polyimide resin which is a representative heat-resistant polymer. The present inventors have found that the overall properties of a COPNA resin as a base resin for a heat-resistant insulating layer are significantly superior to those of a polyimide resin.

A COPNA resin is a thermosetting resin prepared by a polycondensation reaction of a starting material which is either a fused polycyclic aromatic hydrocarbons or a mixture of a fused polycyclic aromatic hydrocarbon and a monocyclic aromatic hydrocarbon, with a crosslinking agent which is an aromatic compound having at least two hydroxymethyl or halomethyl groups on the aromatic ring, in the presence of an acid catalyst. The resin has a chemical structure comprising aromatic rings which contain fused polycyclic aromatic rings such as naphthalene rings, these aromatic rings being linked through methylene bonds to form a three-dimensional network. Thus, unlike a polyimide resin, there are no polar groups such as imide, amide, ester, or hydroxyl groups in the polymer molecule and therefore a COPNA resin has very low water absorption.

The fused polycyclic aromatic hydrocarbon compound used as a starting material in the preparation of a COPNA resin includes naphthalene, acenaphthene, phenanthrene, anthracene, pyrene, and similar fused-ring aromatic compounds as well as hydroxyl-substituted derivatives thereof such as naphthol. These compounds may also have an alkyl substituent as a ring substituent. The monocyclic aromatic hydrocarbon compound which may be used as a starting material as a mixture with a fused polycyclic aromatic hydrocarbon compound includes phenolic compounds such as phenol, alkylphenols, and resorcinol; biphenyl, diphenyl ether, and alkylbenzenes. Preferably, such a monocyclic compound, when used, comprises less than 50% by weight of the starting mixture. One or more compound may be used for the fused polycyclic and monocyclic starting compounds.

Also included in the useful polycyclic or monocyclic starting material are polynuclear compounds having two or more aromatic polycyclic or monocyclic rings attached through a hydrocarbyl linking group such as a methylene, phenylene, or xylylene group. Furthermore, heavy oils and pitches derived from coal tar or petroleum may be used as a starting material as long as they are comprised predominantly of aromatic hydrocarbon compounds as mentioned above.

The crosslinking agent that is reacted with the starting material is an aromatic compound having at least two hydroxymethyl or halomethyl groups as ring substituents, i.e., monocyclic or polycyclic aromatic compounds such as benzene, xylene, naphthalene, and anthracene which have two or more hydroxymethyl or halomethyl groups on the aromatic ring. Specific examples of such a compound include di(hydroxymethyl)benzene (or xylylene glycol), di(hydroxymethyl)xylene, tri(hydroxymethyl)benzene, di(hydroxymethyl)naphthalene, and di(chloromethyl)benzene. It is preferred that the crosslinking agent be an aromatic compound having two or more hydroxymethyl substituents. One or more of these compounds may be used.

A polycondensation reaction of the starting material with the crosslinking agent is carried out in the presence of an acid catalyst. A preferred catalyst is a sulfonic acid which is either water-insoluble or reactive with at least one of the starting material and the crosslinking agent.

Water-insoluble sulfonic acids useful as a catalyst include acidic water-insoluble resins having sulfonic acid groups. Examples of these acidic resins include a polystyrenesulfonic acid resin prepared by crosslinking a styrene polymer with divinylbenzene followed by sulfonation, a phenolsulfonic acid resin prepared by condensation of a phenolsulfonic acid or naphthalenesulfonic acid with an aldehyde or an aromatic compound having at least two hydroxymethyl or halomethyl substituents, and a sulfonation product of a COPNA resin. Another water-insoluble sulfonic acid catalyst is an organic sulfonic acid having one or more hydrophobic groups. Examples of such a compound are dinonylnaphthalenesulfonic acid and didodecylbenzenesulfonic acid.

Examples of a sulfonic acid useful as a catalyst which is reactive with the crosslinking agent include aromatic sulfonic acids having a fused polycyclic aromatic nucleus such as a naphthalene nucleus or a phenolic nucleus (e.g., naphthalenesulfonic acid), as well as aromatic sulfonic acids having a functional group selected from carboxyl, amino, epoxy, and unsaturated hydrocarbon groups. Examples of a sulfonic acid catalyst which is reactive with the starting material include aromatic sulfonic acids having a hydroxymethyl, halomethyl, or formyl group such as hydroxymethylbenzenesulfonic acid, chloromethylbenzenesulfonic acid, formylbenzenesulfonic acid, and the corresponding naphthalene sulfonic acids.

The amount of the acid catalyst used depends on the reactivity of the starting material and the reaction temperature. It is generally at least about 0.2%, preferably about 1%–20%, and more preferably not more than 10% by weight based on the total weight of the starting material and the crosslinking agent.

The molar ratio of the crosslinking agent to the total weight of the starting material and the acid catalyst is preferably in the range of about 0.7–6 and more preferably in the range of about 1–3.

The reaction temperature is generally from about 50° C. to about 200° C. and preferably about 80°–180° C. The polycondensation reaction is usually performed at atmospheric pressure or under slight pressure. However, in order to facilitate removal from the reaction system of the water or hydrogen halide formed as a by-product, a subatmospheric pressure may also be employed. The reaction can be conveniently carried out in the form of a melt, although a suitable solvent or dispersion medium may be used in the reaction, As the polycondensation reaction proceeds, the viscosity of the reaction mixture increases, resulting in the formation of the desired prepolymer of a COPNA resin for use in the preparation of an insulating layer according to the present invention. If the reaction further proceeds with heating, the prepolymer will be converted into an infusible, insoluble cured mass which cannot be processed to form an insulating layer. Preferably, the prepolymer of the COPNA resin has a number-average molecular weight in the range of about 500–2000.

The insulating layer according to the present invention which includes a flexible or rigid substrates for printed circuit boards and an insulating film for semiconductor devices can be produced in the same manner employed in the production of a conventional polyimide-based insulating layer except that a COPNA resin is used in place of a polyimide resin.

A flexible substrate for printed circuit boards can be produced, for example, by dissolving a COPNA resin (prepolymer) in a suitable solvent such as tetrahydrofuran, dimethylformamide, methyl ethyl ketone, dioxane, or dimethylsulfoxide, casting the resulting solution into a film, and drying the film to remove the solvent, usually with heating. The film formation may be performed by another technique such as extrusion or injection molding. The thickness of the film as a flexible substrate is usually in the range of from about 10 μm to about 1 mm. The film may optionally contain one or more additives. Examples of such additives include fatty acid ester plasticizers and nonionic dispersants.

The resulting COPNA resin film may be subjected to post-curing, if necessary, in order to control the flexibility of the film as a flexible substrate. The post-curing can be performed, for example, by heating for about 10 minutes to about 1 hour at a temperature of about 190°–230° C. As the post-curing progresses, the film ultimately lose its flexibility and forms a rigid film, which can be used as a rigid substrate of the neat (non-reinforced) type. In the case of such a rigid substrate, the film thickness may be increased up to about 2 mm.

Insulating substrates for printed circuit boards are frequently sold in the form of copper-clad substrates. A flexible or rigid substrate consisting essentially of a COPNA resin produced as above can be fabricated into a copper-clad substrate by applying an adhesive to both surfaces of the substrate film and interposing the film between two sheets of copper foil such as electrolytic copper foil followed by pressing. A phenolic adhesive or an uncured COPNA resin itself can be used as an adhesive.

A fiber-reinforced rigid substrate can be produced by the conventional prepreg technique. The formation of prepregs from a COPNA resin (prepolymer) may be carried out by either the solvent method or the hot melt method. In the solvent method, reinforcing fibers are impregnated with a resin solution (varnish) prepared by dissolving a COPNA resin in a suitable solvent as exemplified above and then heated so as to remove the solvent and form a prepreg. In the hot melt method, reinforcing fibers are interposed between two sheets of release paper, at least one of which has a coating of a COPNA resin formed by application of a hot melt of the COPNA resin, and then the fibers and sheets are passed through a nip of heated rolls to cause the resin to melt and impregnate into the fibers. Removal of the release paper upon cooling gives a prepreg.

The reinforcing fibers used in the preparation of a prepreg may be any insulating fibers which have been used in the production of rigid substrates for printed circuit boards. Usually, glass fibers, particularly those having a low dielectric constant are employed as reinforcement. The reinforcing fibers may be in the form of a cloth, mat, or tape. The content of a COPNA resin in a prepreg is preferably in the range of about 20%–80% and more preferably about 30%–50% by weight. The prepreg may further contain one or more additives such as flame retardants and coupling agents.

Prior to the formation of a prepreg, glass fibers used as reinforcement may be preliminarily subjected to surface treatment in order to enhance the adhesion of a COPNA resin to the glass fibers in a prepreg and finally-produce a rigid substrate having an increased flexural strength. A useful surface treating agent is an aromatic compound having at least two hydroxymethyl or halomethyl groups, that is, the compound to be used as a crosslinking agent in the preparation of a COPNA resin. An example of such a compound is xylylene glycol. Another surface treating agent useful for this purpose is an alkoxysilane compound which is well known as a silane coupling agent. It is preferred to use an alkoxysilane compound having one or more amino groups such as 3-aminopropyltriethoxysilane, N-(2-aminoethyl)-3-aminopropyl-trimethoxysilane, N-(2-aminoethyl)-2-aminopropylmethyl-dimethoxysilane, and the like.

The surface treatment can be performed by dissolving a surface treating agent in an organic solvent, e.g., an alcohol or ketone, and applying the resulting solution to the surface of glass fibers by spraying, immersion, or similar technique.

Thereafter, the glass fibers are heated such that the solvent is removed and the applied surface treating agent is chemically bonded to the surface of the fibers by reactions between the hydroxyl or oxo groups present on the surface of grass fibers and hydroxymethyl, halomethyl, amino, or alkoxy groups in the surface treating agent. Heating may be continued for about 0.5–2 hours at about 80°–130° C., for example.

A plurality of plies of the prepreg formed in the above manner are laminated in the conventional manner to produce a fiber-reinforced rigid substrate for printed circuit boards. Such a rigid substrate usually has a thickness of about 0.4–20 mm. Laminating may be performed by subjecting about 5 to 20 plies, for example, of the prepreg to hot pressing under conditions sufficient to thermally bond the prepreg plies together and cure the COPNA resin to a degree desirable for a rigid substrate. Preferable hot pressing conditions include a temperature of about 120°–230° C., an applied pressure of about 25–100 kgf/cm$^2$, and a holding time of about 10–120 minutes. Hot presing may be conducted after the prepreg plies are interposed between two sheets of copper foil in order to directly produce a copper-clad rigid substrate (copper-clad laminate). Such a sequence is commonly employed in a commercial process. In this case, there is no need to use an adhesive in order to bond the copper foil to the resin laminate.

The copper foil used to produce a copper-clad insulating substrate is usually an electrolytic copper foil due to its purity. When an electrolytic copper foil is used in the above-described hot pressing step, it may be subjected to surface treatment prior to use in order to enhance the bond strength attained by hot pressing. Like the surface treatment of glass fibers, a useful surface treating agent for copper foil is the compound to be used as a crosslinking agent in the preparation of a COPNA resin (aromatic compound having at least two hydroxymethyl or halomethyl compound, e.g., xylylene glycol). The manner and conditions for surface treatment of copper foil may be the same as those in the surface treatment of glass fibers described above. Like glass fibers, copper foil has functional groups such as hydroxyl or carbonyl groups on the surface thereof which are reactive with hydroxymethyl or halomethyl groups of the aromatic compound and serve to chemically bond the aromatic compound to the foil surface. The aromatic compound bonded to the surface of the copper foil is still reactive with the COPNA resin in a prepreg and hence enhances the bond strength between the copper foil and the prepreg attainable in hot pressing to form a copper-clad laminate.

Another method for surface treatment of copper foil is chromate treatment using a chromating solution which contains $Cr^{6+}$ ions and a reducing agent and which preferably further contains colloidal silica. Chromate treatment of copper foil may be performed by applying the chromating solution to copper foil by spraying, immersion, or similar technique followed by drying with heating to form a chromate film on the surface of the copper foil. The heating is usually conducted for about 2–30 minutes at a relatively low temperature of about 50°–80° C. since it is not necessary to reduce all the cr$^{6+}$ ions to $Cr^{3+}$ ions by heating. The resulting chromate film on the copper foil contains residual $Cr^{6+}$ ions, which are considered to act oxidatively on the COPNA resin in a prepreg to form carbonyl groups in the resin during hot pressing with the prepreg. The carbonyl groups can enhance the bond strength between the copper foil and the prepreg as described above.

A copper-clad flexible or rigid insulating substrate prepare, as described above may be processed to form a circuit thereon in a conventional manner. The processing usually include the steps of coating the copper surface of the substrate with a photoresist, performing imagewise exposure using either a pattern mask or a patterned laser beam, developing the exposed photoresist with a suitable developing solution, etching the areas of the copper foil which are no longer covered with the photoresist, and removing the residual photoresist. Additional fabrication steps such as the formation of through holes may be performed on the substrate to manufacture a printed circuit board.

Due to the excellent heat resistance, particularly long-term heat resistance of the COPNA resin-based insulating substrate according to the present invention, the resulting printed circuit board may be used in the form of a multi-layered printed circuit board, which generally has an increased packaging density and tends to generate an increased quantity of heat during operation of the electronic devices mounted thereon.

An insulating film of a COPNA resin for semiconductor devices can be produced by dissolving the COPNA resin in a suitable solvent, e.g., an alcohol or ketone, applying the resulting solution onto the surface of a semiconductor device to be insulated, e.g., a single substrate layer in the case of an interfacial insulating film for multilayered insulating substrates or a p-n junction in the case of a passivation film, by a conventional coating technique such as spin coating, and heating the coating to remove the solvent and form a dry film. Alternatively, a solution of a COPNA resin can be cast to form a film in the same manner as described for the production of a flexible substrate and the resulting film may be used as an insulating film for semiconductor devices by applying the film to the surface to be insulated with the aid of a suitable adhesive as described above.

The insulating film for semiconductor devices prepared by either coating or casting preferably has a thickness of from about 10 μm to about 1 mm. If desired, the insulating film may be subjected to post-curing in order to enhance the mechanical properties and control the flexibility of the film. The post-curing conditions may be the same as described above for the flexible substrate. In the case of an insulating film produced by casting, it is preferable to perform the post-curing before the film is applied to the surface of a semiconductor device to be insulated.

In the manufacture of a multilayered printed circuit board in which adjacent substrate layers are separated through an interfacial insulating film, it is preferable that both the resin present in each insulating substrate layer and the resin used to form the interfacial insulating film be comprised of a COPNA resin according to the present invention. The COPNA resin can provide the multilayered printed circuit board with improved heat resistance including long-term heat resistance and hence improved reliability and performance compared to a polyimide resin.

The following examples are presented to further illustrate the present invention. These examples are to be considered in all respects as illustrative and not restrictive. In the examples, all the parts and percents are by weight unless otherwise indicated. The measurements for properties other than dielectric constant of copper-clad flexible or rigid substrates in the examples were performed using a test specimen from which the copper foil had been removed by etching in a ferric chloride solution prior to the test.

EXAMPLE 1

This example illustrates the production of a flexible insulating substrate for printed circuit boards according to the present invention.

A mixture of 100 parts of naphthalene as a starting material, 173 parts of p-xylylene glycol as a crosslinking agent, and 8.3 parts of β-naphthalenesulfonic acid as an acid catalyst reactive with the crosslinking agent was heated for 3 hours at 110° C. with stirring for polycondensation to give a i0 prepolymer of a COPNA resin as a clear, umber mass. The molar ratio of p-xylylene glycol to naphthalene was 1.6. The resulting COPNA resin prepolymer had a melt viscosity of 16,500 cP at 70° C., and the number-average molecular weight of the resulting COPNA resin was about 1,000.

The COPNA resin prepolymer prepared in this manner was dissolved in tetrahydrofuran to form a resin solution having solids content of 50%. The resin solution was cast into a film and heated for 30 minutes at 190° C. to remove the tetrahydrofuran solvent. The resulting 25 μm-thick flexible film was used as the desired flexible insulating substrate for copper cladding in the following manner.

A small amount of the COPNA resin prepared in the above manner was melted at about 80° C. and applied as an adhesive to both surfaces of the flexible film as a substrate and the flexible film was interposed between two sheets of electrolytic copper foil having a thickness of about 35 μm and pressed to give a flexible copper-clad substrate.

Using the flexible copper-clad substrate, the dielectric constant and water absorption of the flexible substrate were determined in accordance with the testing method specified in JIS C 6471. The long-term heat resistance of the flexible substrate was evaluated by an ageing test performed for 1000 hours in an air oven maintained at various temperatures, and the maximum long-term heat resisting temperature was determined as the highest temperature at which the weight loss after the 1000 hour-ageing was within 2%.

For comparison, a copper-clad flexible substrate was prepared from a commercially-available polyimide resin (sold by Toray under the tradename "Kapton") in the same manner as described above except that a polyimide-based adhesive was used as an adhesive and it was tested with respect to the above-described properties.

The results are shown in Table 1 below.

TABLE 1

| Properties | Resin | |
|---|---|---|
| | COPNA resin | Polyamide |
| Max. long-term heat resisting temp. | ca. 260° C. | ca. 200° C. |
| Dielectric constant at 1 MHz | 3.1 | 3.5 |
| Water absorption | 0.37% | 2.9% |

The flexible substrate made of a COPNA resin according to the present invention exhibited an excellent long-term heat resistance which is significantly higher than that of the conventional heat-resistant flexible substrate made of a polyimide resin. Furthermore, it surpassed the conventional polyimide substrate with respect to dielectric constant and water absorption. A COPNA resin film having the above properties is also useful as an insulating film for semiconductor devices.

EXAMPLE 2

This example illustrates the production of a glass fiber-reinforced rigid laminate-type substrate using a COPNA resin.

The COPNA resin prepared in Example 1 was dissolved in tetrahydrofuran to give a solution having a solids content of 50% and a viscosity of 50 cP at 25° C. to be used as resin varnish. A tape of plain-woven T-glass cloth having a thickness of 0.1 mm and a bulk density of 104.5 g/m² was passed through the COPNA resin varnish for resin impregnation. The impregnated glass cloth was dried for 1 hour at 60° C. to remove the solvent and obtain a glass cloth prepreg having a resin content of about 35%.

A plurality of plies of the glass cloth prepreg sufficient to form a 1.6 mm-thick laminate were interposed between two sheets of electrolytic copper foil having a thickness of 35 μm and hot-pressed for 60 minutes at a pressure of 100 kgf/cm² and a temperature of 230° C. to give a copper-clad rigid laminate substrate having a thickness of about 1.6 mm.

The properties of the rigid substrate were determined in the same manner as described in Example 1. For comparison, the same measurements were performed on a commercially available heat-resistant, polyimide-based, rigid laminate substrate (sold by Hitachi under the tradename "PI-671"). The test results are shown in Table 2 below.

TABLE 2

| Properties | Resin | |
|---|---|---|
| | COPNA resin | Polyamide |
| Max. long-term heat resisting temp. | ca. 260° C. | ca. 200° C. |
| Dielectric constant at 1 MHz | 3.7 | 4.7 |
| Water absorption | 0.3% | 1.0% |

Like the flexible substrate prepared in Example 1, the rigid substrate based on a COPNA resin according to the present invention significantly surpassed the conventional polyimide-based heat-resistant rigid substrate in all properties tested.

EXAMPLE 3

This example illustrates the preparation of a post-cured COPNA resin film useful as an insulating film for semiconductor devices.

The COPNA resin prepared in Example 1 was dissolved in tetrahydrofuran to form a resin solution having a solids content of 50%. The solution was cast into a film and heated for 30 minutes at 120° C. to remove the solvent and give a 10 μm-thick flexible film. The film was then subjected to post-curing four 30 minutes at 200° C. The dielectric constant, maximum long-term heat resisting temperature, and water absorption of the resulting post-cured film were approximately the same as those determined in Example 1. Thus, the film can be used as an insulating film for semiconductor devices and it is also useful as a flexible substrate for printed circuit boards.

EXAMPLE 4

A copper-clad rigid laminate substrate was prepared in the same manner as described in Example 2 except that the T-glass cloth was subjected to surface treatment before it was impregnated with a COPNA resin varnish.

The surface treatment was performed by spraying the T-glass cloth with a 10 mol % solution of p-xylylene glycol in ethanol in an amount of 100 g/m² and then heating for 1 hour at 80° C. to remove the solvent and react the glycol with the surface of glass fibers.

The flexural strength of the glass-reinforced rigid laminate substrate was evaluated in accordance with JIS C 6481 after removal of the copper foil by etching- The flexural strength of the rigid laminate substrate prepared in Example 2 in which the T-glass cloth had not been surface-treated was also determined. The results are shown in Table 3.

EXAMPLE 5

A copper-clad rigid laminate substrate was prepared in the same manner as described in Example 2 except that the T-glass cloth was subjected to surface treatment before it was impregnated with a COPNA resin varnish.

The surface treatment was performed by immersing the T-glass cloth in one of various aqueous 1% solutions of different alkoxysilane compounds for 5 minutes at room temperature and then heating for 20 minutes at 110° C.

The flexural strength of the glass-reinforced rigid laminate substrate was determined in the same manner as described in Example 4. The results are shown in Table 3 below.

TABLE 3

| Surface treating agent | Flexural strength |
| --- | --- |
| p-Xylylene glycol | 70 kgf/mm$^2$ |
| 3-Aminopropyltriethoxysilane | 70 kgf/mm$^2$ |
| 3-Methacryloxypropyltrimethoxysilane | 50 kgf/mm$^2$ |
| 4-Glycidylbutytrimethoxysilane | 52 kgf/mm$^2$ |
| Benzyltriethoxysilane | 42 kgf/mm$^2$ |
| None | 35 kgf/mm$^2$ |

It can be seen from the above results that surface treatment of glass fibers with either p-xylylene glycol which is a compound useful as a crosslinking agent in the preparation of a COPNA resin or an amino-containing alkoxysilane compound provided the glass-reinforced rigid substrate with a significantly increased flexural strength.

EXAMPLE 6

A copper-clad rigid laminate substrate was prepared in the same manner as described in Example 2 except that the electrolytic copper foil was subjected to surface treatment before it was used to form a copper-clad laminate.

The surface treatment was performed by spraying the electrolytic copper foil with a 10 mol % solution of p-xylylene glycol in ethanol in an amount of 100 g/m$^2$ and then heating for hour at 80° C.

The bond strength of the copper foil in the resulting copper-clad, glass-reinforced rigid laminate substrate was evaluated by determining the peel strength of copper foil in accordance with JIS C 6481. The peel strength of the copper foil was 1.0 kgf/cm. On the other hand, the peel strength of copper foil in the rigid laminate substrate prepared in Example 2 in which the copper foil had not been surface-treated was 0.3 kgf/cm.

EXAMPLE 7

A copper-clad rigid laminate substrate was prepared in the same manner as described in Example 2 except that the electrolytic copper foil was subjected to surface treatment before it was used to form a copper-clad laminate.

The surface treatment was performed by spraying the electrolytic copper foil with a commercially available coating-type chromating solution (sold by Kansai Paint under the tradename "Cosmer") which had been dilated 10-fold in volume with water. The amount of the diluted chromating solution sprayed was 100 g/m$^2$. After the spraying, the copper foil was heated for 1 hour at 80° C.

The bond strength of the copper foil in the resulting copper-clad, glass-reinforced rigid laminate substrate was evaluated in the same manner as in Example 6. The peel strength of the copper foil was 1.0 kg/cm.

It will be appreciated by those skilled in the art that numerous variations and modifications may be made to the invention as described above with respect to specific embodiments without departing from the spirit or scope of the invention as broadly described.

What is claimed:

1. A copper-clad substrate for use in the fabrication of printed circuit boards, comprising an electrical insulating substrate having a copper foil bonded to each surface thereof, wherein said electrical insulating substrate consists essentially of a polycondensed fused polycyclic, polynuclear aromatic resin prepared by a polycondensation reaction of a starting material with a crosslinking agent in the presence of an acid catalyst, wherein the starting material is selected from the group consisting of fused polycyclic aromatic hydrocarbons which may have a hydroxyl group as a ring substituent and mixtures of a fused polycyclic aromatic hydrocarbon and a monocyclic aromatic hydrocarbon both of which may have a hydroxyl group as a ring substituent and wherein the crosslinking agent is an aromatic compound having at least two hydroxymethyl or halomethyl groups as ring substituents, said electrical insulating substrate having a long-term heat resisting temperature of about 260° C., said temperature determined as the highest temperature at which the weight loss after 1000 hours of aging in air was within 2% by weight; a dielectric constant at 1 MHz of about 3.1, and a water absorption of about 0.4% or less as measured by immersion in water for 24 hours at 25° C.

2. The copper-clad substrate of claim 1, wherein the starting material is naphthalene or a mixture of naphthalene and phenol.

3. The copper-clad substrate of claim 1, wherein the crosslinking agent is an aromatic compound having at least two hydroxymethyl groups.

4. The copper-clad substrate of claim 1, wherein the crosslinking agent is p-xylylene glycol.

5. The copper-clad substrate of claim 1, wherein the copper foil is bonded to the substrate with the aid of an adhesive.

6. The copper-clad substrate of claim 1, wherein the copper foil is surface-treated with an aromatic compound having at least two hydroxymethyl or halomethyl groups before cladding.

7. The copper-clad substrate of claim 1, wherein the copper foil is surface-treated with a chromating solution.

8. A copper-clad substrate for use in the fabrication of printed circuit boards, comprising an electrical insulating substrate having a copper foil bonded to each surface thereof, wherein said electrical insulating substrate consists essentially of a polycondensed fused polycyclic, polynuclear aromatic resin and glass fibers, said polycondensed fused polycyclic, polynuclear aromatic resin being prepared by a polycondensation reaction of a starting material with a crosslinking agent in the presence of an acid catalyst, wherein the starting material is selected from the group consisting of fused polycyclic aromatic hydrocarbons which may have a hydroxyl group as a ring substituent and mixtures of a fused polycyclic aromatic hydrocarbon and a monocyclic aromatic hydrocarbon both of which may have a hydroxyl group as a ring substituent and wherein the crosslinking agent is an aromatic compound having at least two hydroxymethyl or halomethyl groups as ring substituents, and said electrical insulating substrate having a long-term heat resisting temperature of about 260° C. said temperature determined as the highest temperature at which the weight loss after 1000 hours of aging in air was within 2% by weight; a dielectric constant at 1 MHz of about 3.7; and a water absorption of about 0.4% or less as measured by immersion in water for 24 hours at 25° C.

9. The copper-clad substrate of claim 8, wherein the starting material is naphthalene or a mixture of naphthalene and phenol.

10. The copper-clad substrate of claim 8, wherein the crosslinking agent is an aromatic compound having at least two hydroxymethyl groups.

11. The copper-clad substrate of claim 10, wherein the crosslinking agent is p-xylylene glycol.

12. The copper-clad substrate of claim 8, wherein the electrical insulating substrate is in the form of a rigid laminate substrate prepared by lamination of a plurality of plies of prepreg having glass fibers impregnated with the polycondensed fused polycyclic, polynuclear aromatic resin.

13. The copper-clad substrate of claim 12, the copper foil being bonded to the substrate by hot pressing simultaneously with lamination of plies of the prepreg.

14. The copper-clad substrate of claim 8, wherein the glass fibers are surface-treated with an aromatic compound having at least two hydroxymethyl or halomethyl groups.

15. The copper-clad substrate of claim 8, wherein the glass fibers are surface-treated with an alkoxysilane compound containing one or more amino groups.

16. The copper-clad substrate of claim 8, wherein the copper foil is surface-treated with an aromatic compound having at least two hydroxymethyl or halomethyl groups before cladding.

17. The copper-clad substrate of claim 8, wherein the copper foil is surface-treated with a chromating solution.

18. A multilayered printed circuit board, which comprises a plurality of layers each comprised of a printed circuit board formed from the copper-clad substrate of claim 8 and one or more interfacial insulating films placed alternately with the layers so as to insulate adjacent substrate layers, said one or more interfacial insulating films consisting essentially of the polycondensed fused polycyclic, polynuclear aromatic resin defined in claim 8.

19. A semiconductor device comprising a semiconductor and an electrical insulating film on said semiconductor, wherein the electrical insulating film consists essentially of a polycondensed fused polycyclic, polynuclear aromatic resin prepared by a polycondensation reaction of a starting material with a crosslinking agent in the presence of an acid catalyst, wherein the starting material is selected from the group consisting of fused polycyclic aromatic hydrocarbons which may have a hydroxyl group as a ring substituent and mixtures of a fused polycyclic aromatic hydrocarbon and a monocyclic aromatic hydrocarbon both of which may have a hydroxyl group as a ring substituent and wherein the crosslinking agent is an aromatic compound having at least two hydroxymethyl or halomethyl groups as ring substituents, said electrical insulating film having a long-term heat resisting temperature of about 260° C., said temperature determined as the highest temperature at which the weight loss after 1000 hours of aging in air was within 2% by weight; a dielectric constant at 1 MHz of about 3.1; and a water absorption of about 0.4% or less as measured by immersion in water for 24 hours at 25° C.

20. The semiconductor device of claim 19, wherein the starting material is naphthalene or a mixture of naphthalene and phenol.

21. The semiconductor device of claim 19, wherein the crosslinking agent is an aromatic compound having at least two hydroxymethyl groups.

22. The semiconductor device of claim 21, wherein the crosslinking agent is p-xylylene glycol.

23. The semiconductor device of claim 19, which comprises the electrical insulating film as an interfacial insulating film.

24. The semiconductor device of claim 19, which comprises the electrical insulating film as a passivation film.

25. The semiconductor device of claim 19, which comprises the electrical insulating film as a buffer film.

26. The semiconductor device of claim 19, which comprises the electrical insulating film as an α-ray shielding film.

27. The semiconductor device of claim 19, wherein the device is a multichip module.

* * * * *